United States Patent
Lin

(10) Patent No.: US 7,656,668 B2
(45) Date of Patent: Feb. 2, 2010

(54) SECURE DEVICE FOR A HEAT SINK AND CPU

(75) Inventor: Sheng-Huang Lin, Kaohsiung (TW)

(73) Assignee: Asia Vital Components Co., Ltd., Kaohsiung (TW)

( * ) Notice: Subject to any disclaimer, the term of this patent is extended or adjusted under 35 U.S.C. 154(b) by 0 days.

(21) Appl. No.: 11/742,595

(22) Filed: May 1, 2007

(65) Prior Publication Data

US 2008/0273301 A1 Nov. 6, 2008

(51) Int. Cl.
H05K 7/20 (2006.01)
F28F 7/00 (2006.01)
A44B 21/00 (2006.01)

(52) U.S. Cl. ............... 361/710; 165/80.2; 165/80.3; 165/185; 257/719; 361/709; 361/719; 361/679.54; 24/459; 248/505; 248/510

(58) Field of Classification Search ............ 24/459; 248/510; 257/718–719; 361/719, 709, 710, 361/679.54
See application file for complete search history.

(56) References Cited

U.S. PATENT DOCUMENTS

| | | | | |
|---|---|---|---|---|
| 5,953,212 A * | 9/1999 | Lee | | 361/709 |
| 6,108,207 A * | 8/2000 | Lee | | 361/704 |
| 6,111,752 A * | 8/2000 | Huang et al. | | 361/704 |
| 6,181,559 B1 * | 1/2001 | Seo | | 361/704 |
| 6,250,375 B1 * | 6/2001 | Lee et al. | | 165/80.3 |
| 6,418,022 B1 * | 7/2002 | Chen | | 361/704 |
| 6,421,242 B1 * | 7/2002 | Chen | | 361/704 |
| 6,731,504 B1 * | 5/2004 | Liu | | 361/704 |
| 6,754,080 B2 * | 6/2004 | Lee et al. | | 361/710 |
| 6,775,138 B2 * | 8/2004 | Lee et al. | | 361/697 |
| 6,826,052 B2 * | 11/2004 | Ma | | 361/709 |
| 6,876,551 B2 * | 4/2005 | Lee et al. | | 361/702 |
| 7,061,764 B2 * | 6/2006 | Lai et al. | | 361/704 |
| 7,292,442 B2 * | 11/2007 | Yu et al. | | 361/704 |
| 7,292,444 B1 * | 11/2007 | Yang et al. | | 361/709 |
| 7,310,229 B2 * | 12/2007 | Lee et al. | | 361/697 |
| 7,391,615 B2 * | 6/2008 | Fu et al. | | 361/704 |
| 7,397,663 B2 * | 7/2008 | Chen et al. | | 361/704 |
| 7,430,121 B2 * | 9/2008 | Lu et al. | | 361/719 |
| 7,467,443 B2 * | 12/2008 | Lin | | 24/459 |
| 2005/0024832 A1 * | 2/2005 | Lee et al. | | 361/704 |
| 2007/0025083 A1 * | 2/2007 | Lin | | 361/704 |
| 2007/0115638 A1 * | 5/2007 | Yu et al. | | 361/704 |

FOREIGN PATENT DOCUMENTS

DE 29612047 U1 * 9/1996

* cited by examiner

*Primary Examiner*—Anatoly Vortman

(57) ABSTRACT

A secure device for a heat sink and CPU includes a main support arm and an operation handler. The main support arm has a first hook section at one end thereof and provides a contact face and a movable second hook section at another end thereof. The operation handle further includes a main operation part and a handle part and the main operation part provides a guide groove with a first end and a second end. The guide groove extends along radial direction of main operation part from the first end to the second end and a uvula is formed between the first end and the second end. The circumferential side of the main operation part defines a press section for touching the contact face and a pivotal shaft is movably joined to the guide groove and the second hook section to actuate the second hook section moving upward or downward to selectively perform engagement or loosening while the pivotal shaft moving along the guide groove between the first and second ends.

7 Claims, 9 Drawing Sheets

SECURE DEVICE FOR A HEAT SINK AND CPU

BACKGROUND OF THE INVENTION

1. Field of the Invention

The present invention is related to a secure device for a heat sink and CPU and particularly to a secure device for a heat sink capable of dissipating heat of a central processing unit (CPU).

2. Brief Description of the Related Art

The electronic information product such as the computer has been widely applied in our daily life. Due to demand, the electronic information technology has developed rapidly to upgrade operation speed and increase data access capacity. Accordingly, high heat generates along the components in the electronic information product operating with high speed.

Taking the host unit of the computer as an example, the CPU produces a large part of the heat generation in the computer. Besides, the heat accumulation of the CPU exceeding the allowable limit results in breaking down of the computer. Further, in order to solve problem related to electromagnetic interference, the host unit is enclosed by a case, which hinders heat dissipation of the computer. How to guide heat from the CPU and other electronic components fast is an important subject.

The conventional way to dissipate heat of the CPU is to place a side of a heat sink on top of the CPU. The heat sink provides a plurality of cooling fins at another side thereof to transmit the heat. Further, a fan is provided in association with the heat sink to dissipate the heat rapidly. Hence, the CPU and the heat sink have to keep contact with each other tightly. In case of poor contact between the CPU and the heat sink, heat resistance increases and degrades the heat dissipation largely. A conventional secure device 7 for a CPU shown in FIGS. 1 and 2 provides an engaging lever 71 and the engaging lever 71 provides a vertical part 710 at an end thereof. The free end of the vertical part 710 provides a through hole 711 to engage with a projection (not shown) of the fixing base H. Another end of the engaging lever 71 provides two slots 712 for being pierced with an end of the hanging part 72. The hanging part 72 provides fitting holes 721 at the end thereof to join the operation member O with a pivot S passing through an eccentric hole O1 and the fixing holes 721. Once the operation member O is stirred, the engaging hole 722 of the hanging part 72 engages with another projection H1 of the fixing base. In this way, the heat sink R is secured to the CPU C.

The preceding conventional secure device 7 employing resisting force created by an eccentric cam has the following deficiencies:

(1) The operation member O and the hanging part 72 are connected to each other in an immobile way such that the vertical motion of the hanging part 72 depends on the operation member O producing displacement of releasing section or fixing section by means of eccentric cam. However, the eccentric cam has a lower dead point and increments of different curvatures such that it may result in dropping off thereof and in shocks. As a result, the engaging lever 71 fails to operate the hanging part 72 or is detached from the hanging part 72.

(2) The operation member O may easy to become inclined after the secure device 7 engaging the heat sink.

(3) The CPU C undesirably contacts with the heat sink R to increase the thermal resistance so as to influence effect of heat dissipation greatly.

SUMMARY OF THE INVENTION

Accordingly, in order to overcome the preceding disadvantages, an object of the present invention is to provide a secure device for a heat sink and CPU in which the main operation part of a circular shape with a penetrating guide groove to allow a pivotal shaft moving along the guide groove such that problems of failing operation and detachment between the operation member and contact face of the support arm due to dropping off and shocks between the press section of the main operation part and the contact face of the support arm are avoidable.

Another object of the present invention is to provide a secure device for a heat sink and CPU with which the CPU keeps contact with the heat sink tightly to reduce thermal resistance and enhance effect of heat dissipation.

Accordingly, a secure device for a heat sink and CPU according to the present invention includes a main support arm and an operation handle. The main support arm has a first hook section at one end thereof and provides a contact face and a movable second hook section at another end thereof. The operation handle further includes a main operation part and a handle part and the main operation part provides a guide groove with a first end and a second end. The guide groove extends along radial direction of main operation part from the first end to the second end and a uvula is formed between the first end and the second end. The circumferential side of the main operation part defines a press section for touching the contact face and a pivotal shaft is movably joined to the guide groove and the second hook section to actuate the second hook section for moving upward or downward so as to selectively perform engagement or loosening while the pivotal shaft moving along the guide groove between the first and second ends.

BRIEF DESCRIPTION OF THE DRAWINGS

The detail structure, the applied principle, the function and the effectiveness of the present invention can be more fully understood with reference to the following description and accompanying drawings, in which.

DETAILED DESCRIPTION OF THE INVENTION

Figure 1:
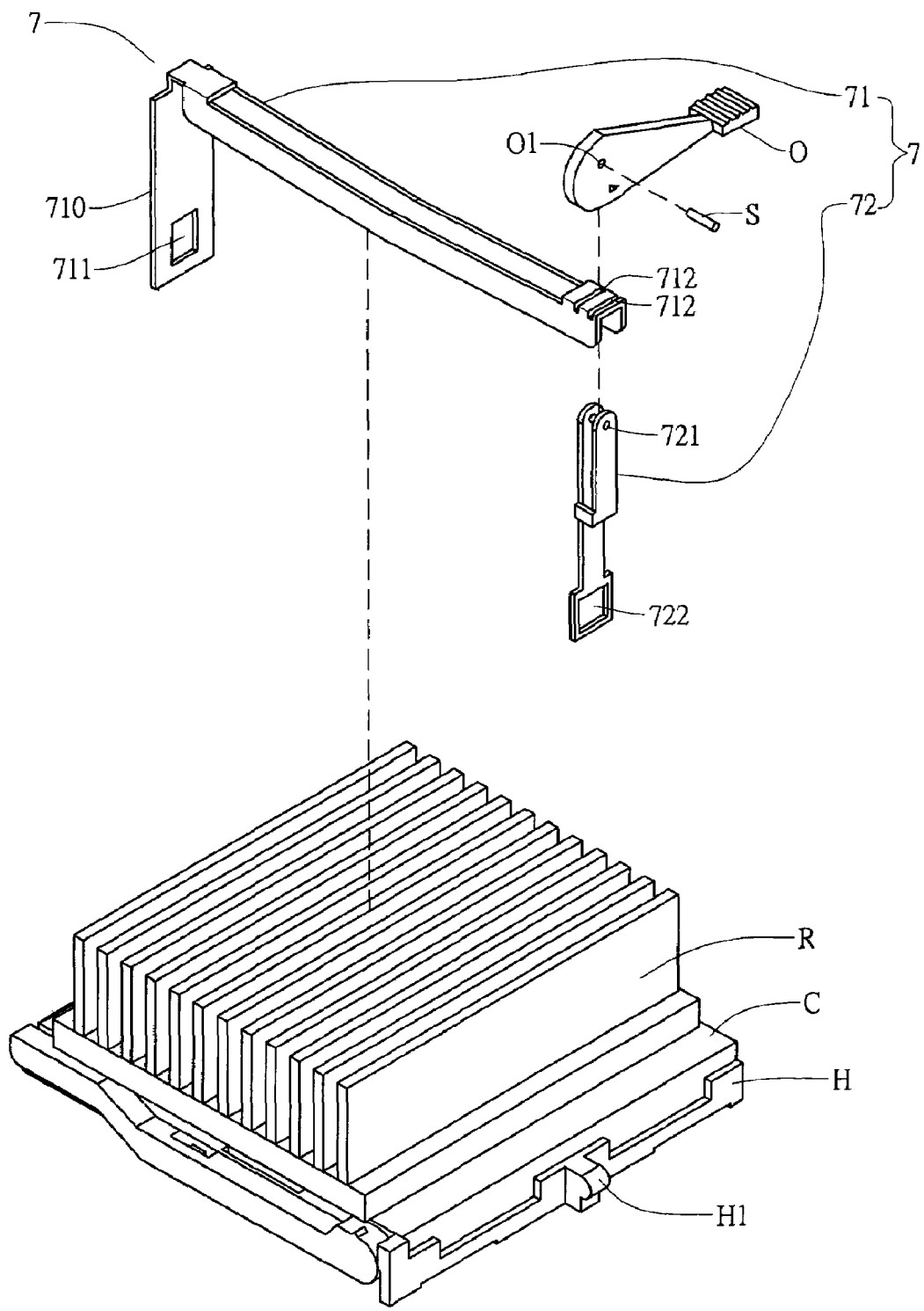
FIG. 1 is a disassembled perspective view of the conventional secure device.
Figure 2:
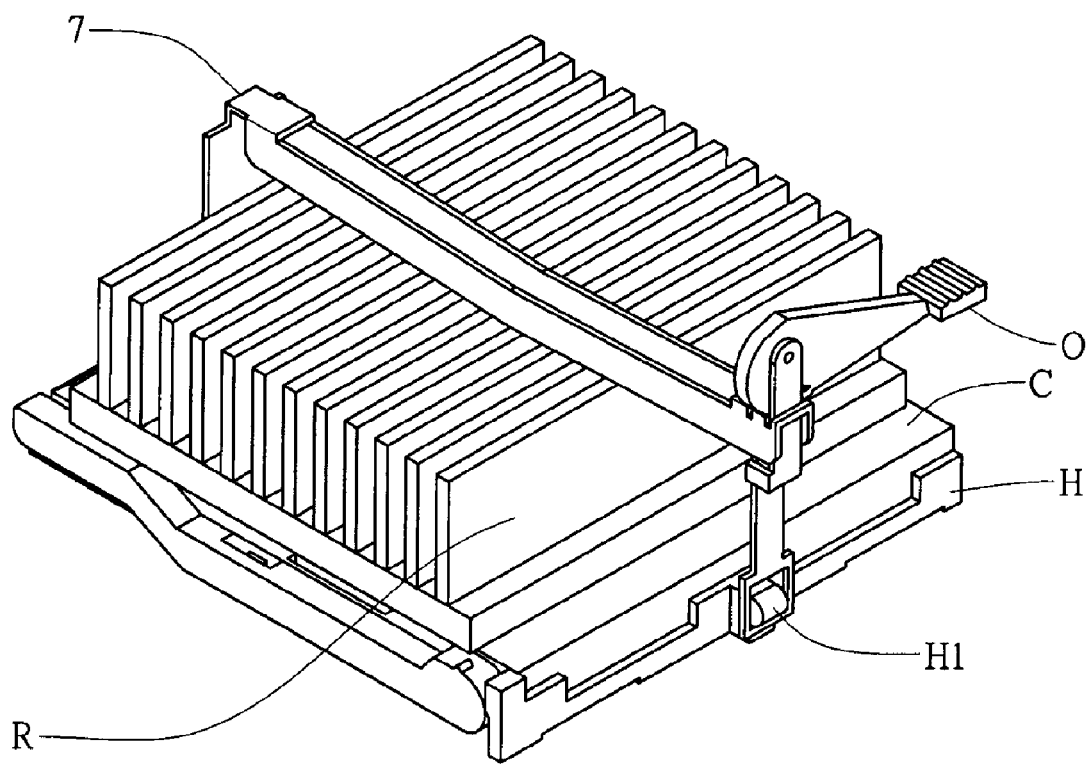
FIG. 2 is an assembled perspective view of the conventional secure device shown in FIG. 1.
Figure 3:
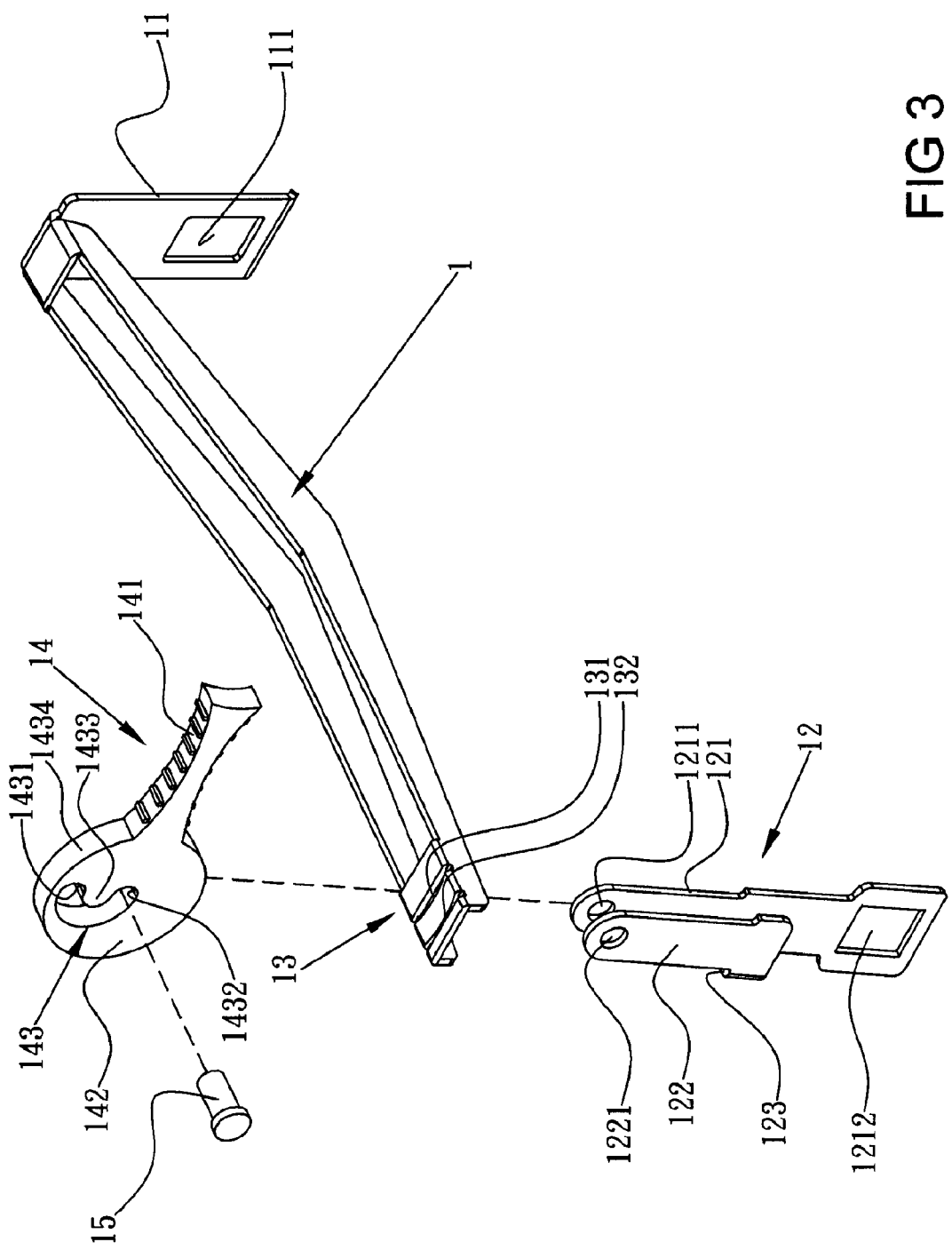
FIG. 3 is a disassembled perspective view of a secure device for a heat sink and CPU according to the present invention.
Figure 4:
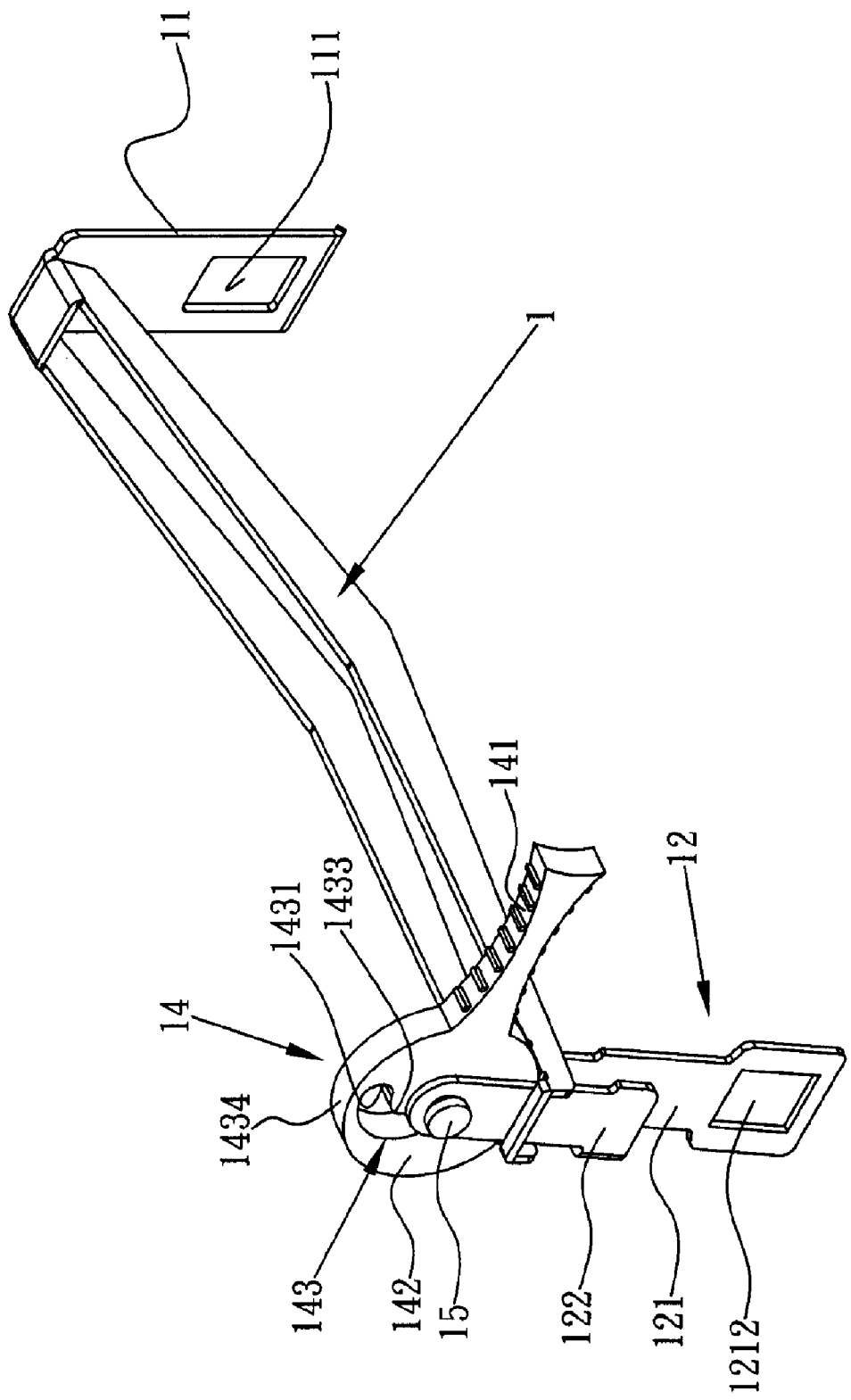
FIG. 4 is an assembled perspective view of FIG. 3.

Referring to FIGS. 3 and 4, the preferred embodiment of a secure device for a heat sink and CPU according to the present invention includes a main support arm 1 and an operation handle 14. The main support arm 1 is made of metal with good elasticity and an end of the main support arm 1 integrally extends a hook section 11 vertically with a first engaging hole 111 near the free end of the hook section 11. Another end of the main support arm 1 provides a contact face 13 with two slots 131, 132. A second hook section 12 provides a first plate member 121 and a second plate member 122 spacing apart from each other with a connecting plate 123 joining the two plate members 121, 122. A first fitting hole 1211 and a second fitting hole 1221 are provided at an end of the first plate member 121 and the second plate member 122 respectively and the two fitting holes 1211, 1221 are corresponding to each other. Another end of the first plate member 121 provides a second engaging hole 1212.

The operational handle 14 includes a circular plate-shaped main operation part 142 and a handle part 141, which extends from the main operation part 142. The main operation part 142 provides a curved through guide groove 143 with a first end 1431 and a second end 1432 such that a uvula 1433 is formed between the first and second ends 2431, 1432. The main operational part 142 is defined a press section 1434 at the circumferential side thereof for touching the contact face 13 at the portion between the two slots 131, 132 so that the portion between the two slots 131, 132 has a surface concave downward for a greater area capable of contacting with the press part 1434 of the main operational part 142 and the main operational part 142 capable of rotating on the contact face 13 steadily.

One of the first and second ends 1431, 1432 of the guide groove 143 is disposed away from the center of the main operational part 142 and the other one of the ends 1431, 1432 is disposed near the center of main operational part 142. That is, a distance between one of the ends 1431, 1432 and the press section 1434 is less than that between the other one of the ends 1431, 1432 and the press section 1434. It can be seen in FIG. 3 that the first end 1431 is far from the center of the main operation part 142 and the second end 1432 is near the center of the main operation part 142 such that the distance between the first end 1431 and the press section 1434 is less than that between the second end 1432 and the press section 1434.

The first plate member 121 and the second plate member 122 with the ends thereof providing the first and second fitting holes 1211, 1221 penetrate the slots 131, 132 respectively along two lateral sides of the main operational part 142 so as to be disposed corresponding to the guide groove 143. A pivotal shaft 15 is arranged to pass through the second fitting hole 1222, the guide groove 143 and the first fitting hole 1211 sequentially such that the guide groove 143 is capable of pivotally connecting with each other. In this way, the guide groove 143 connecting with the second hook section 12 is capable of being movably joined to the main support arm 1.

Figure 5:
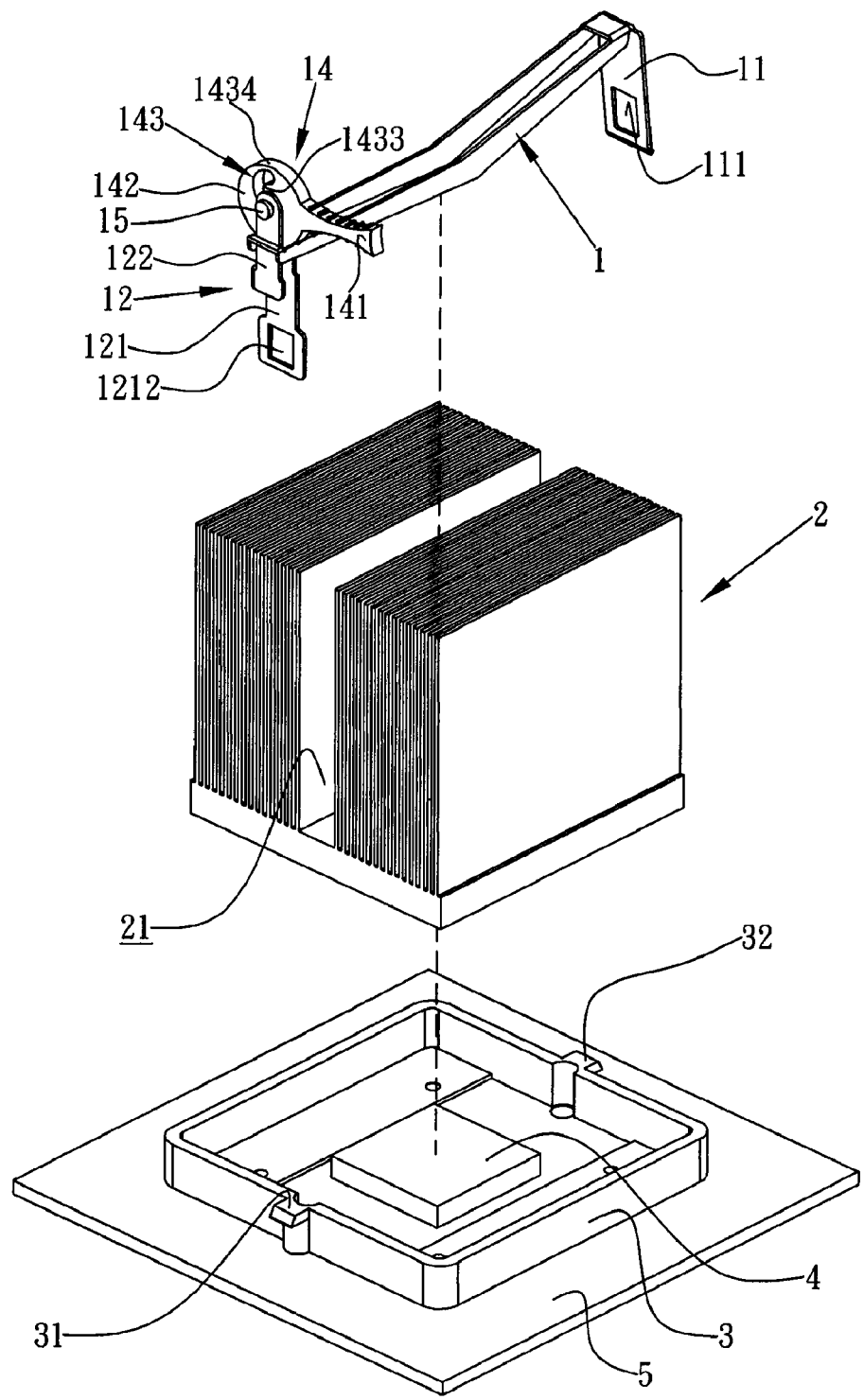
FIG. 5 is a perspective view illustrating the secure device of the present invention being detached from the heat sink.
Figure 6:
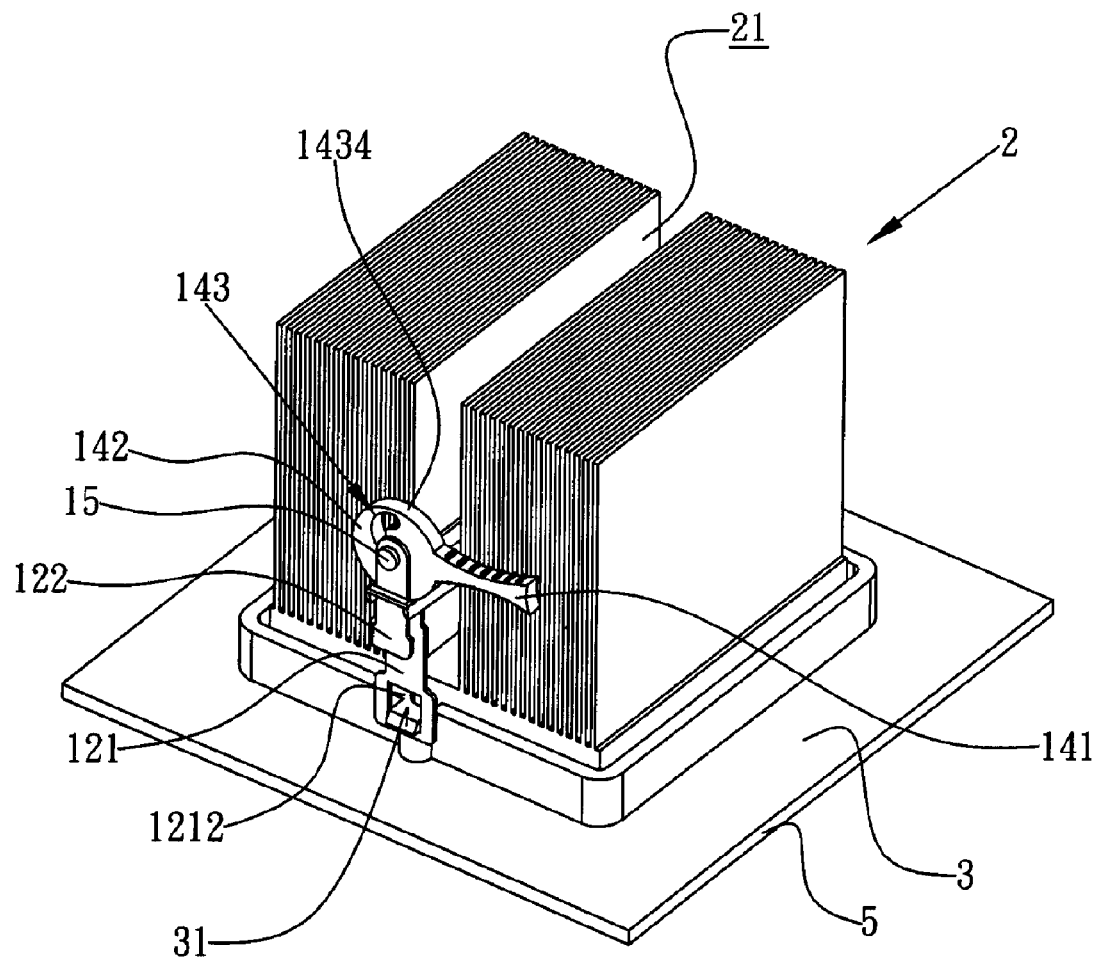
FIG. 6 is a perspective view illustrating the secure device of the present invention in a state of engaging the heat sink.

Referring to FIGS. 5 and 6, the secure device of the present invention is employed to engage a heat sink 2 to a heat generating component 4. The heat sink 2 is made of metal with good heat conductivity such as aluminum or copper and a plurality of cooling fins provided on the heat sink 2 increase heat dissipation area. The type of the heat sink 2 illustrated in FIGS. 5 and 6 are not unique and other type heat sinks, which are fabricated with such as aluminum extrusion, pressing cast and stacking, are available. The heat sink 2 usually has a fixing recess 21 at the middle thereof for receiving the main support arm 1 of the secure device. The heat sink 2 is placed on top of the heat generating component 4 to transmit heat energy produced by the heat generating component 4 outward and cool the heat generating component.

The heat dissipating component such as CPU is provided on a circuit board 5 and the circuit board has a locating base 3 surrounding the heat generating component 4 and two opposite sides of the locating base 3 provides at least a projection 31, 32 corresponding to the first and second engaging holes 111, 1212 of the first hook section 11 and the second hook section 1212 respectively.

Once the main support arm 1 is placed in the locating recess 21 with the first and second hook sections 11, 12 being disposed at two ends of the main support arm 1 in a way of the first engaging hole 111 engaging with the corresponding projection 32, the second engaging hole 1212 of the second hook section 12 is capable of engaging with the corresponding projection 31 and the second hook section 12 becomes a movable lock for the secure device being secured to the two opposite sides of the locating base 3.

Figure 7:
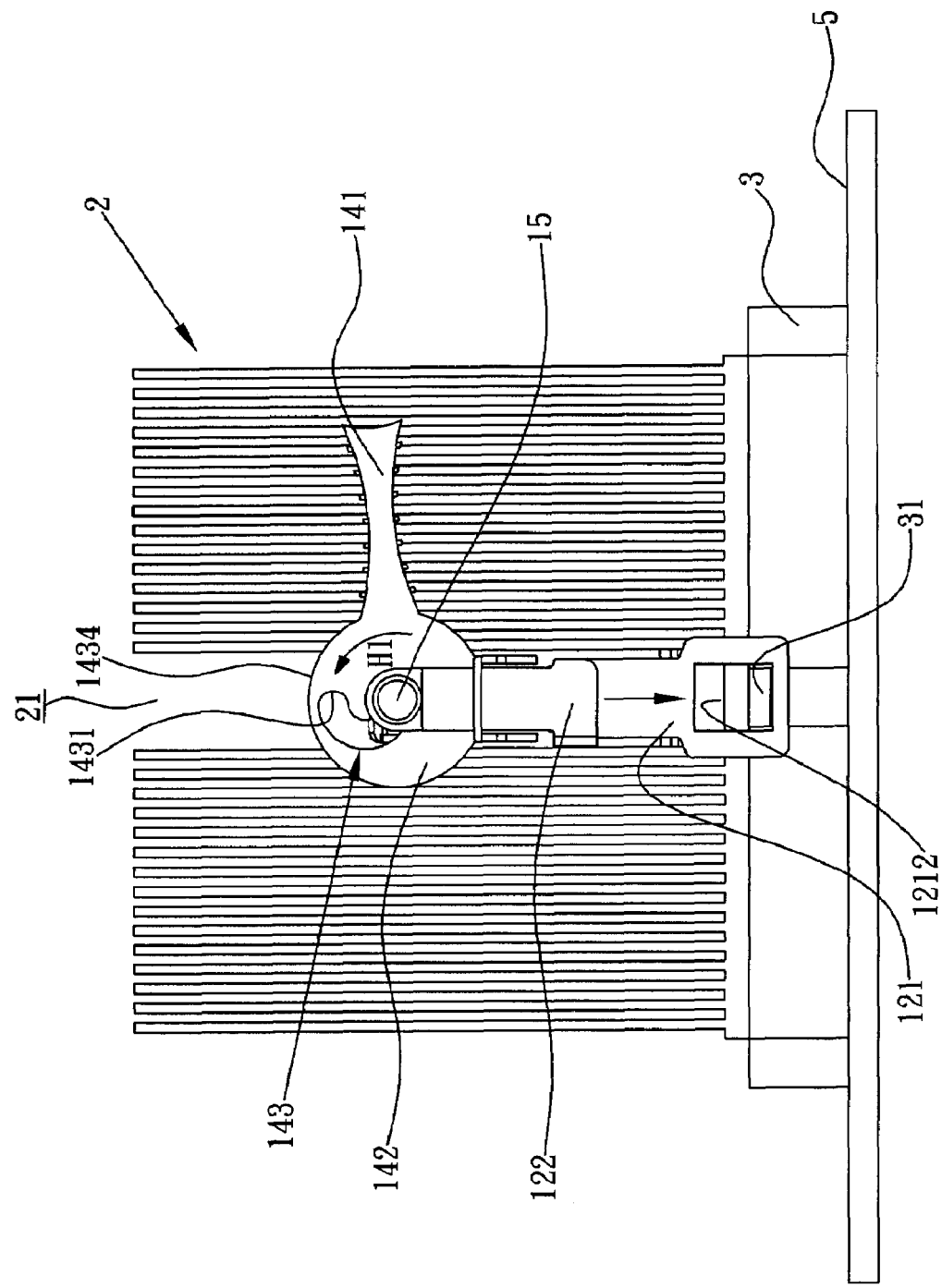
FIG. 7 is a plan view illustrating the secure device of the present invention being released from the state of engaging the heat sink.
Figure 8:
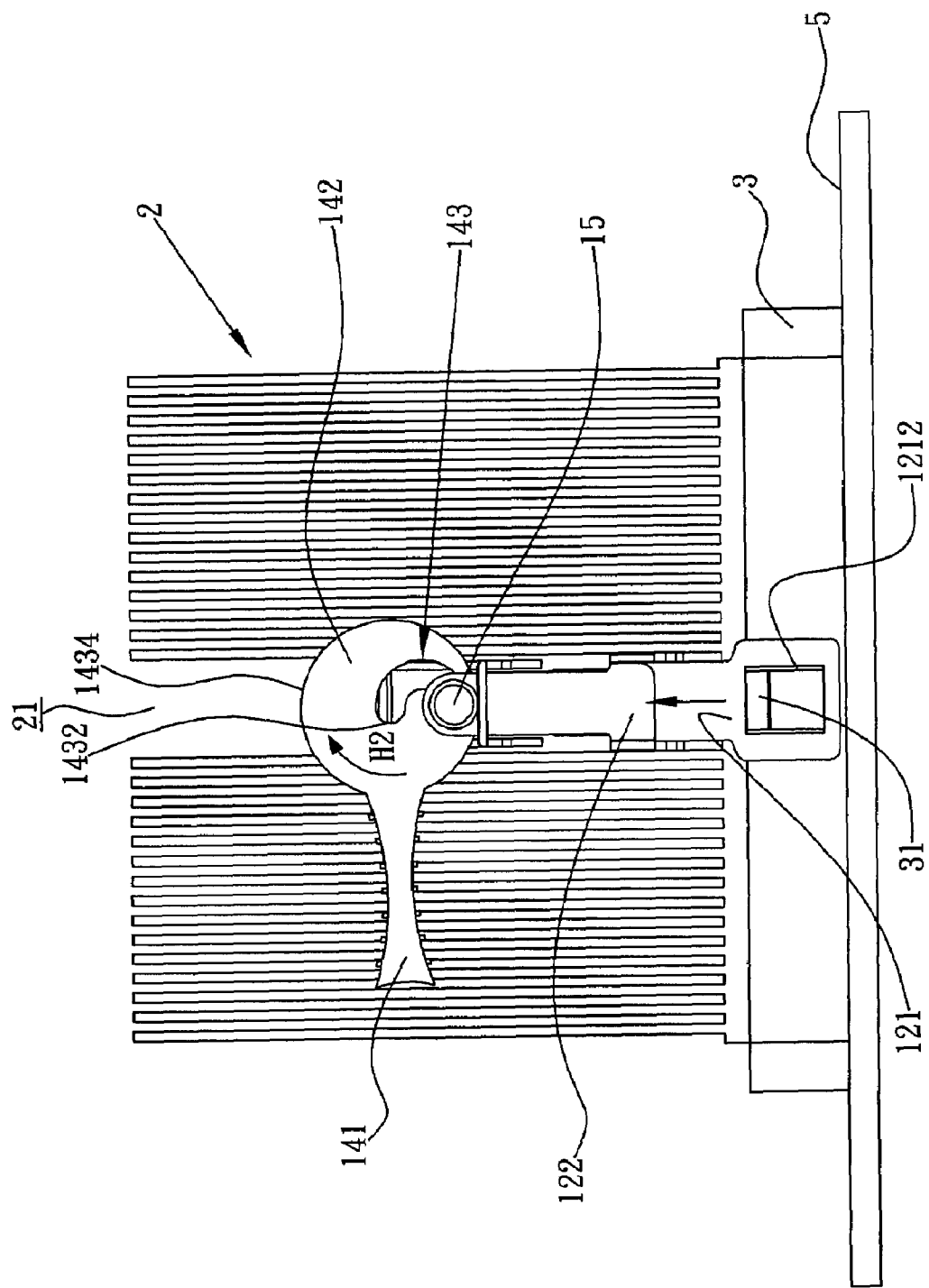
FIG. 8 is a plan view illustrating the secure device of the present invention being engaged to the heat sink from the state of releasing the heat sink.
Figure 9:
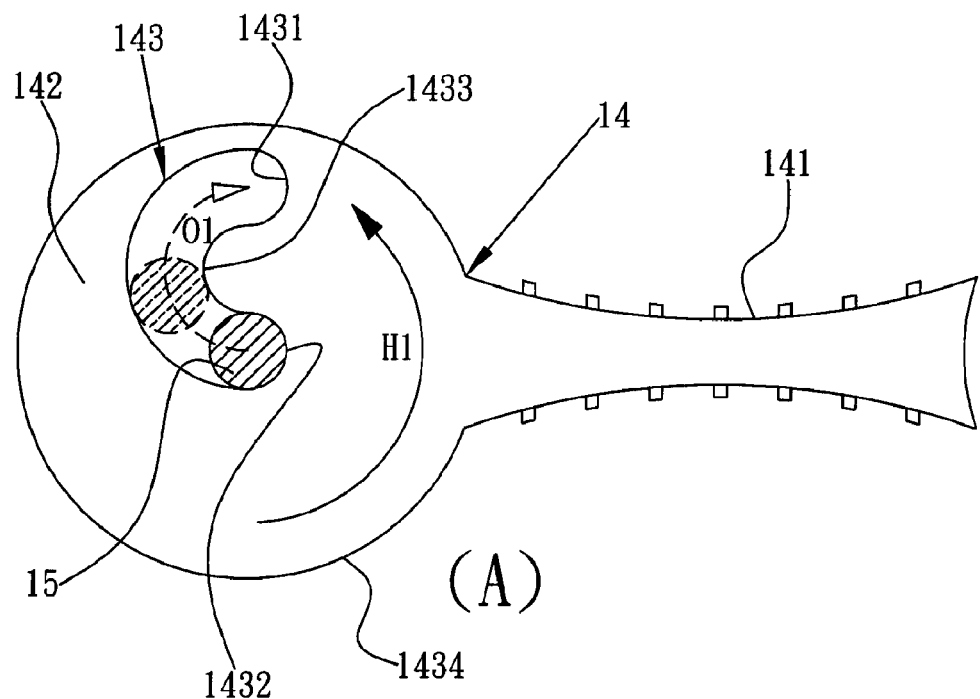
FIG. 9A is a plan view illustrating the movable shaft actuating in the groove while the secure device of the present invention being released from the state of engaging the heat sink.
FIG. 9B is a plan view illustrating the movable shaft actuating in the groove while the secure device of the present invention being engaged to the heat sink from the state of releasing the heat sink.
Figure 9:
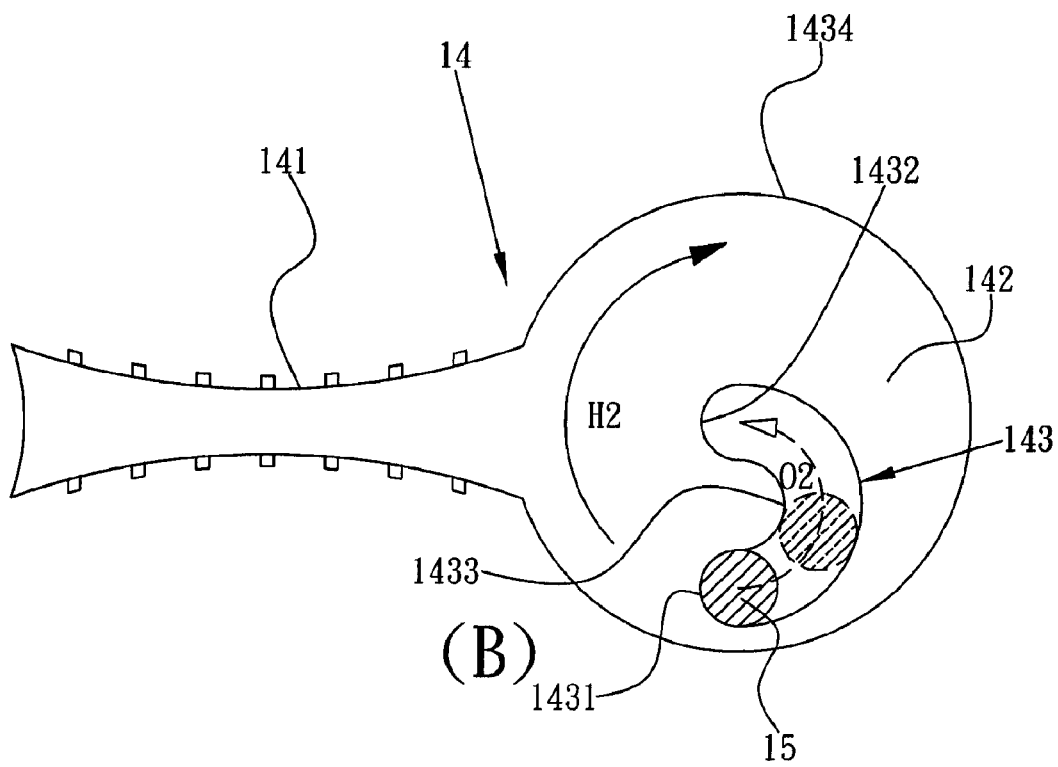

Referring to FIGS. 7, 8, 9A and 9B in company with FIG. 3, the secure device of the present invention is in a state of securing the heat sink 2 as shown in FIG. 7 and it can be seen that the secure device of the present invention is received in the fixing recess 21 and the projection 31 engages with the engaging hole 1212 of the first plate member 121. When the heat sink 2 is going to be released, the handle part 141 is moved upward to rotate the main operational part 142 counterclockwise along direction of arrow H1 to allow the press section 1434 moving away the contact face 13 and the curved groove 143 moves relative to the pivotal shaft 15 at the same time as shown in FIG. 9A. Under this circumference, the pivotal shaft 15 moves away from the second end 1432 along the groove 143 toward the first end 1431 after passing over the uvula 1433 as the dash arrow 01 shows. When the operation handle 141 is moved to the left side as shown in FIG. 8, the pivotal shaft 15 reaches the first end 1431 as shown in FIG. 9B. Right at the time, the second hook section 12 moves downward to allow the second engaging hole 1212 being free from the projection 31 of the locating base 3 and the main support arm 1 loosens the pressing force to exert the heat sink 2 for the secure device and the heat sink 2 conveniently. Once the secure device is going to engage the heat sink 2 to the heat generating component 4 from the state shown in FIG. 8, the handle part 141 is lifted and rotates the main operational part 142 clockwise along the direction shown with arrow H2 and the groove moves relative to the pivotal shaft 15 as shown in FIG. 9B. Under this circumference, the pivotal shaft 15 moves toward the second end 1432 after passing over the uvula 3 along the groove 143 as the direction shown with the dash arrow O2 in FIG. 9 till reaching the second end 1432 as shown in FIG. 9A. In this way, the handle part 141 is moved back to the right as shown in FIG. 7 and the second engaging hole is capable of engaging with the projection 31 tightly. Therefore, the secure device of the present invention secures the heat sink 2 again to contact the heat generating component 4 tightly.

The main operation part 142 of the operation handle 14 is of circular shape and can rotate on the contact face 13 smoothly to overcome the disadvantage of conventional eccentric disk creating shocks and falling off during moving. Besides, the pivotal shaft 15 moving reciprocally in the guide groove 143 to actuate the second hook section 12 to displace it upward and downward, is capable of decreasing shocks of the second hook section 12, thus overcoming difficulties for engaging with the projection. Further, the guide groove 143 provides the first and second ends and the uvula 1433 between the first and second ends so that the reaction force resulting from the second hook section 12 engaging with the projection tightly, is not resulting in the pivotal shaft 15 falling off from the second end 1432 and preventing the second hook section 12 from loosening for avoiding disadvantage of the lower dead point of the conventional art.

While the invention has been described with referencing to preferred embodiments thereof, it is to be understood that modifications or variations may be easily made without departing from the spirit of this invention, which is defined by the appended claims.

What is claimed is:

1. A secure device for a heat sink and CPU comprising:
   a main support arm with two ends providing a first hook section at one of the ends and providing a contact face and a movable second hook section at the other one of the ends; and
   an operation handle further comprising a main operation part and a handle part, the main operation part providing a guide groove with a first end and a second end, the guide groove extending along radial direction of main operation part from the first end to the second end, a uvula being formed between the first end and the second end, the circumferential side of the main operation part defining a press section for touching the contact face, a pivotal shaft being movably joined to the guide groove and the second hook section and actuating the second hook section moving upward or downward to selectively perform engagement or loosening while the pivotal shaft moving along the guide groove between the first and second ends.

2. The secure device for a heat sink and CPU as defined in claim 1, wherein one of the first and second ends is disposed away from the center of the main operation part and the other one of the first and second ends is disposed near the center of the main operation part.

3. The secure device for a heat sink and CPU as defined in claim 1, wherein a distance between the press section and one of the first and second ends is less than that between the press section and another one of the first and second ends.

4. The secure device for a heat sink and CPU as defined in claim 1, wherein the first hook section is integrally joined to the main support arm and provides a first engaging hole.

5. The secure device for a heat sink and CPU as defined in claim 1, wherein the contact face provides two slots, the second hook section further provides a first plate and a second plate, which space apart from the first plate, a connecting plate connecting the first and second plates, the first plate provides a first fitting hole at an end thereof and a second engaging hole at another end thereof, the second plate provides a second fitting hole corresponding to the first fitting hole, the ends with the first and second ends inserting through the slots respectively and the first and second ends are disposed at two sides of the main operation part corresponding to the guide groove.

6. The secure device for a heat sink and CPU as defined in claim 1, wherein the main operation part has a circular disk shape.

7. The secure device for a heat sink and CPU as defined in claim 1, wherein the contact face has a concave downward shape at a portion corresponding to the press section.

\* \* \* \* \*